(12) United States Patent
Graf

(10) Patent No.: US 9,049,775 B2
(45) Date of Patent: Jun. 2, 2015

(54) HOUSING FOR AN ELECTRIC CIRCUIT FOR A FUEL PUMP

(75) Inventor: Rolf Graf, Glashütten (DE)

(73) Assignee: Continental Automotive GmnH, Hannover (DE)

( * ) Notice: Subject to any disclaimer, the term of this patent is extended or adjusted under 35 U.S.C. 154(b) by 115 days.

(21) Appl. No.: 13/809,643

(22) PCT Filed: Jul. 7, 2011

(86) PCT No.: PCT/EP2011/061518
§ 371 (c)(1),
(2), (4) Date: Jan. 11, 2013

(87) PCT Pub. No.: WO2012/007348
PCT Pub. Date: Jan. 19, 2012

(65) Prior Publication Data
US 2013/0120944 A1    May 16, 2013

(30) Foreign Application Priority Data
Jul. 12, 2010   (DE) .......................... 10 2010 026 953

(51) Int. Cl.
*H05K 5/00* (2006.01)
*F02M 37/08* (2006.01)

(52) U.S. Cl.
CPC ............. *H05K 5/0004* (2013.01); *F02M 37/08* (2013.01); *H05K 5/0056* (2013.01); *H05K 5/0082* (2013.01)

USPC ......................................................... 361/752

(58) Field of Classification Search
USPC ................... 361/752, 748, 760, 761
See application file for complete search history.

(56) References Cited

U.S. PATENT DOCUMENTS

| | | | |
|---|---|---|---|
| 4,998,865 A | | 3/1991 | Nakanishi et al. |
| 2004/0235317 A1* | | 11/2004 | Schiefer ........................ 439/76.2 |
| 2008/0115772 A1 | | 5/2008 | Kuperus |
| 2008/0246227 A1 | | 10/2008 | Graf |
| 2009/0183715 A1 | | 7/2009 | Yamamoto et al. |

FOREIGN PATENT DOCUMENTS

| | | |
|---|---|---|
| CN | 101278115 | 10/2008 |
| DE | 42 37 870 A1 | 3/1994 |
| DE | 100 26 756 C2 | 11/2002 |
| DE | 101 62 600 A1 | 7/2003 |
| DE | 10 2007 046 026 A1 | 4/2009 |
| FR | 2 908 696 A1 | 5/2008 |
| WO | WO 2007/031455 A1 | 3/2007 |
| WO | WO 2008/104425 | 9/2008 |

\* cited by examiner

*Primary Examiner* — Andargie M Aychillhum
(74) *Attorney, Agent, or Firm* — Cozen O'Conner

(57) ABSTRACT

A housing for an electronic circuit for a fuel pump includes a base and a cover which is connected to the base, a printed circuit board and, disposed on one side of the latter, electric and/or electronic components. Disposed on either side of the printed circuit board in each case is a cover in such a way that each component is arranged in a region covered by a cover.

8 Claims, 2 Drawing Sheets

HOUSING FOR AN ELECTRIC CIRCUIT FOR A FUEL PUMP

PRIORITY CLAIM

This is a U.S. national stage of PCT International Application No. PCT/EP2011/061518, filed on 7 Jul. 2011, which claims priority to German Application No. 10 2010 026 953.0, filed 12 Jul. 2010, the contents of which are incorporated herein by reference in their entirety.

BACKGROUND OF THE INVENTION

1. Field of the Invention

The present invention is directed to a housing for an electronic circuit for a fuel pump, composed of a printed circuit board, electric and/or electronic components which are arranged on the printed circuit board, a base and a cover which is connected to the base, wherein the base and the cover form the housing.

2. Description of the Related Art

An electronic circuit is used in fuel pumps of motor vehicles in order to feed fuel from a fuel container to an internal combustion engine. The electronic circuit is required to operate the electronically regulated electric motor of the fuel pump. The printed circuit board used here generally is composed of a fiber-reinforced plastic, such as an epoxide, a duroplast a thermoplast, or PTFE. The fiber material used may include a glass fiber, a plastic fiber, a carbon fiber, a plant fiber or paper. Owing to the arrangement of the electronic circuit in the fuel pump or in the immediate surroundings thereof, the electronic components and printed circuit boards have to be protected against the aggressive substances contained in the fuel. Since fuel components also diffuse through printed circuit boards, they do not offer sufficient protection. For this reason, in order to protect the electronic circuit the printed circuit board is arranged with the components inside a sealed metal housing. The feedthroughs for the electronic connections have to be embodied as glass/metal feedthroughs. The disadvantage of these glass/metal feedthroughs is the complexity and the cost involved in manufacturing the seal.

It is also known to arrange components on a ceramic base and to solder the ceramic base to a metal cover, with the result that the components are arranged and protected between the ceramic base and the cover. The ceramic base acts here as a diffusion barrier for the fuel.

A disadvantage in the two embodiments is the considerable cost factor of such housings, which cost factor permits economic use only for high-value applications.

SUMMARY OF THE INVENTION

An object of the present invention is to provide a housing of an electronic circuit whose components are protected sufficiently against fuel. The protection of the electronic circuit is intended to be achieved here in a cost-effective way.

According to this object, a cover is arranged on each of the two sides of a printed circuit board in such a way that each component is arranged in a region covered by a cover.

In this context, use is made of the fact that both printed circuit boards and electronic components have a certain degree of resistance to aggressive substances contained in fuels. With the housing to be produced it is therefore not necessary to achieve an absolute blocking effect, which in turn would be possible only with a hermetically sealed housing. Instead, the already existing resistance of the printed circuit board and of the component is combined with the blocking effect of the housing according to the present invention in order to ensure sufficient protection of the electronic circuit. With the arrangement of the comparatively cost-effective cover on both sides of the printed circuit board, already a large part of the protective effect which makes it possible to avoid complete encapsulation of the printed circuit board is achieved. The housing can therefore be configured more simply and more cost-effectively.

The provision of a second cover also provides the possibility of likewise arranging an electric or electronic circuit on this side of the printed circuit board or of arranging the circuit on both sides of the printed circuit board. As a result, the dimensions of the printed circuit board can be reduced, and a saving can be achieved in terms of weight and in terms of valuable installation space.

A secure and sufficient connection of the covers to the printed circuit board is achieved by virtue of the fact that in each case an enclosed metallic track is arranged in at least the regions of the printed circuit board in which the covers bear, and in that the covers are connected to the respective track by means of a soldered connection.

The metallic tracks for attaching the cover can be manufactured particularly easily if they are composed of the material of the conductor tracks, preferably of copper or gold. In this way, the metallic tracks can be generated with the same methods and devices which are used to apply the conductor tracks.

A contribution is made to increasing the blocking effect if the width of the enclosed metallic tracks is greater than the region of the cover which is connected to the printed circuit board via the soldered connection. The width of the metallic track is a measure of the blocking effect since, like the blocking layer, the metallic track acts as a diffusion barrier.

To this extent, the diffusion travel in the insulation material of the printed circuit board lengthens with an increasing width of the metallic track, as a result of which the protective effect is increased.

In order to avoid adversely affecting the blocking effect of the cover, a further refinement provides for contact to be made between the circuit and the components thereof by means of electrical lines which are led in from the outside, and by means of connecting lines which are embedded in the printed circuit board. For this purpose, contacts are provided which are arranged on the printed circuit board and are connected to the connecting lines which are embedded in the printed circuit board. This avoids the situation in which the cover for making contact is interrupted, which would result in a reduction in the blocking effect. The connecting lines can be embodied as one or more conductor levels which are insulated from one another and arranged one on top of the other in the printed circuit board.

The blocking effect is also prevented from being adversely affected by virtue of the fact that the contacts are arranged outside the metallic tracks on the printed circuit board. For this purpose, it is also conceivable to embody the printed circuit board in a partially enlarged fashion.

The regions of the printed circuit board which are unprotected owing to the contact arrangement can be reduced if the contacts are arranged inside the metallic tracks but outside the covers, wherein the metallic tracks surround the contacts at a distance which is embodied as an annular gap.

The diffusion of fuel via the outer edge which forms the periphery of the printed circuit board is prevented with a blocking layer. The blocking layer is arranged on the periphery of the printed circuit board in such a way that it connects the metallic tracks to one another on both sides of the printed circuit board.

DETAILED DESCRIPTION OF THE PREFERRED EMBODIMENTS

Figure 1:
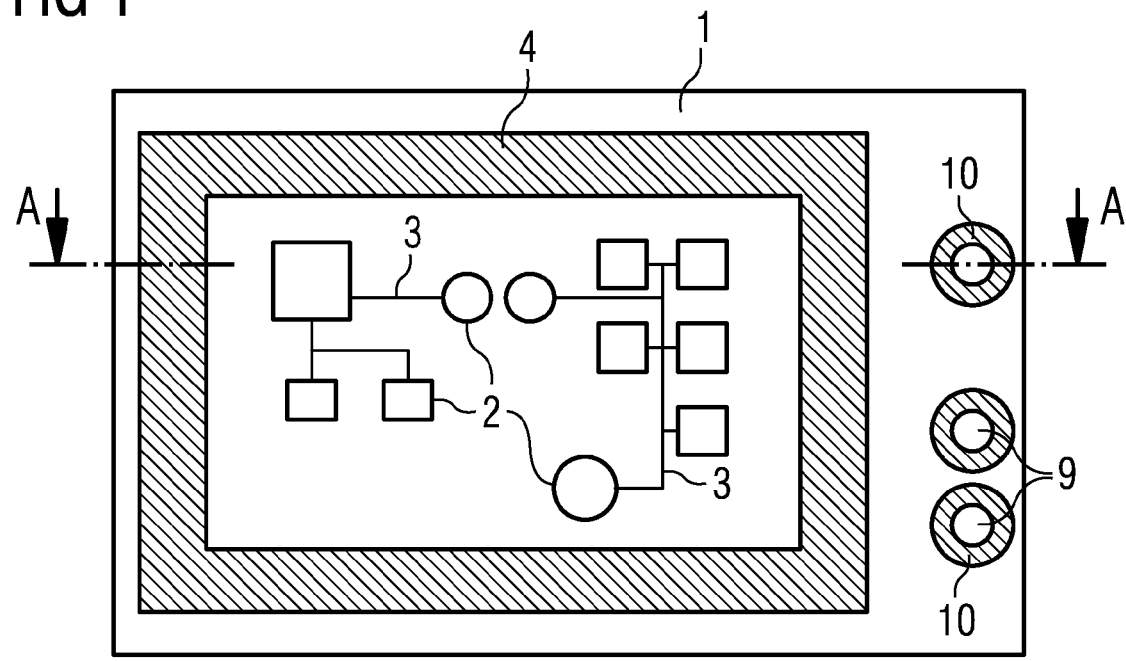
FIG. 1 shows the printed circuit board of a housing according to the invention.

FIG. 1 shows a printed circuit board 1 in a plan view, wherein for the sake of better illustration no cover is shown. Electronic components 2 of an electronic circuit are arranged on the printed circuit board 1 and are connected to one another via conductor tracks 3. In the edge region of the printed circuit board 1, an enclosed metallic track 4, which surrounds the electronic circuit, is arranged. The enclosed metallic track 4 is composed of copper, as are the conductor tracks 3. The printed circuit board 1 is composed of a plastic resin on an epoxide basis. On one side, the printed circuit board 1 has a plurality of breakthroughs 9 outside the enclosed metallic track 4. The breakthroughs 9 are lined with copper. The breakthroughs 9 form contacts 10 for connecting the electronic circuit to corresponding electrical connecting lines, which are not illustrated here.

Figure 2:
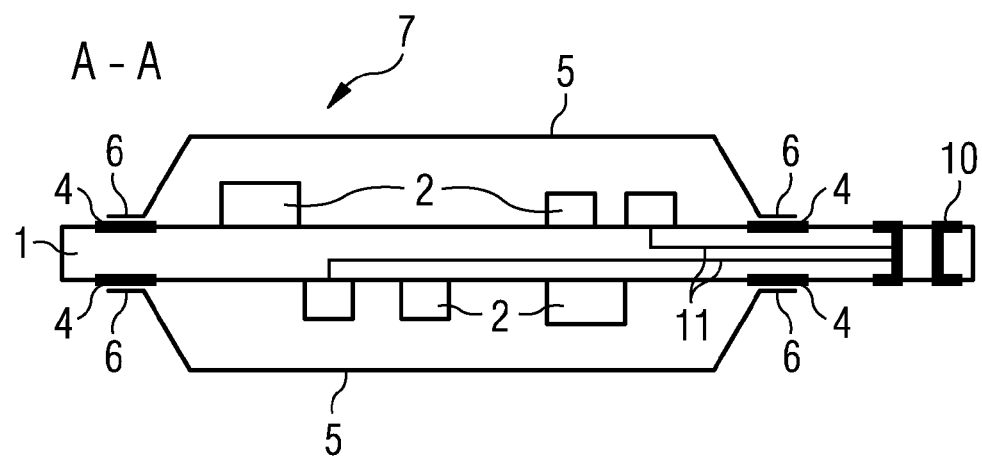
FIG. 2 shows a sectional illustration of the housing according to the invention from FIG. 1.

FIG. 2 shows the printed circuit board 1 in section. The electronic circuit with the components 2 is arranged both on the upper side and the underside of the printed circuit board 1, inside the respective enclosed metallic track 4. In each case a cover 5 made of metal is soldered onto the metallic tracks 4. The said cover 5 completely covers the electronic circuit with the components 2. Edges 6 of the covers 5 are directed outward in the manner of a flange in order to provide a good bearing surface for the connection to the printed circuit board 1. The printed circuit board 1 and the covers 5 therefore form a housing 7. The covers 5 protect the electronic circuit against direct contact with fuel here. Only the unprotected, peripheral edge of the printed circuit board 1 is now still subject to contact with fuel or fuel vapors. As a result, fuel can only pass into the space covered by covers 5 through the printed circuit board material between the metallic tracks 4. The width of the metallic tracks 4 therefore determines the length of the printed circuit board material through which the fuel has to diffuse until the components 2 are reached. For this reason, the blocking effect can be improved even further by widening the metallic tracks 4.

Conductor levels 11 which act as a connecting line are arranged in the printed circuit board 1. The conductor levels 11 connect the components 2 of the electronic circuit on both sides of the printed circuit board 1 to the respective contacts 10.

Figure 3:
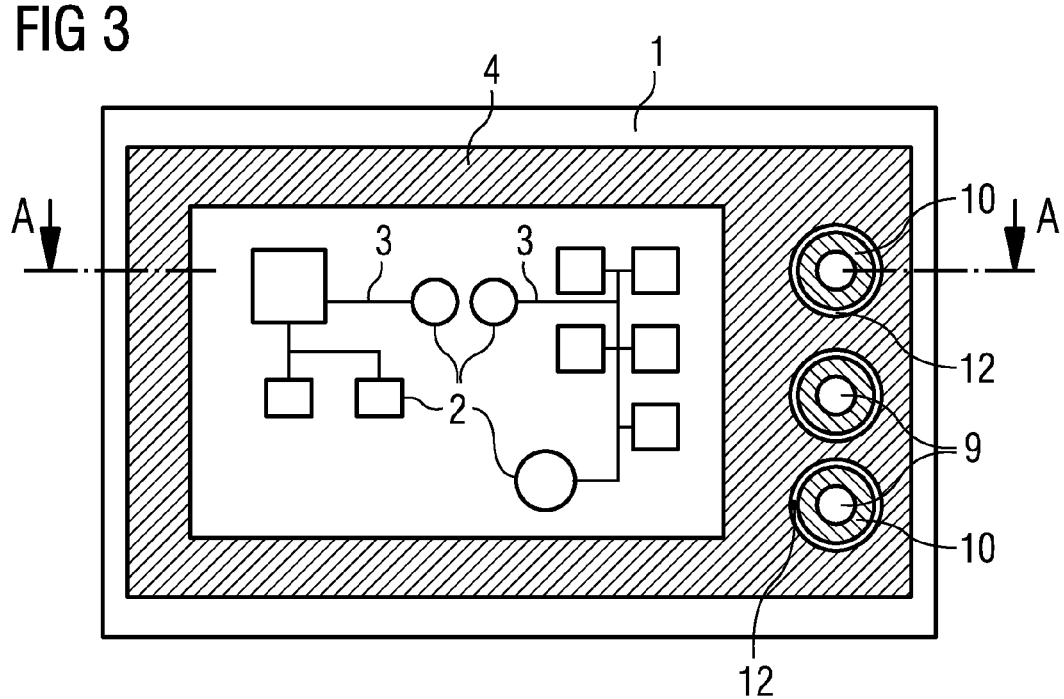
FIG. 3 shows a second embodiment of the printed circuit board according to FIG. 1.
Figure 4:
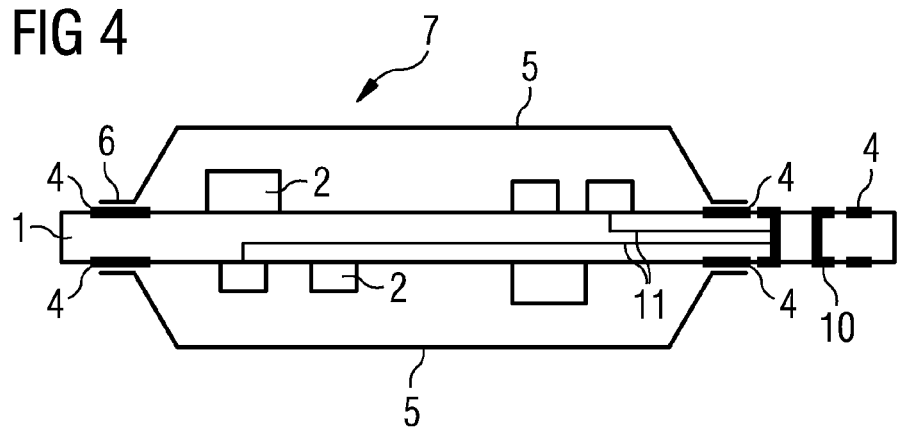
FIGS. 4, 5 show further embodiments of the housing according to FIG. 2.

The printed circuit board 1 which is illustrated in FIGS. 3 and 4 is characterized by changed metallic tracks 4. These are widened to such an extent that they completely enclose the contacts 10. Only a narrow annular gap 12 around each contact 10 ensures the electrical isolation of contact 10 and metallic track 4. This embodiment provides even better protection.

Figure 5:
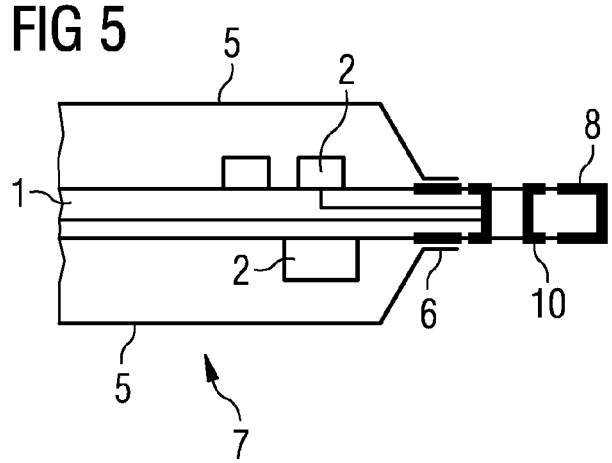

In the printed circuit board 1 in FIG. 5, the previously exposed peripheral edge is provided with a blocking layer 8 in the form of a copper layer, wherein the blocking layer 8 connects the metallic tracks 4 on both sides of the printed circuit board 1, with the result that the surface of the printed circuit board 1 is exposed only in the region of the annular gaps 12.

Thus, while there have shown and described and pointed out fundamental novel features of the invention as applied to a preferred embodiment thereof, it will be understood that various omissions and substitutions and changes in the form and details of the devices illustrated, and in their operation, may be made by those skilled in the art without departing from the spirit of the invention. For example, it is expressly intended that all combinations of those elements and/or method steps which perform substantially the same function in substantially the same way to achieve the same results are within the scope of the invention. Moreover, it should be recognized that structures and/or elements and/or method steps shown and/or described in connection with any disclosed form or embodiment of the invention may be incorporated in any other disclosed or described or suggested form or embodiment as a general matter of design choice. It is the intention, therefore, to be limited only as indicated by the scope of the claims appended hereto.

The invention claimed is:

1. A housing of an electronic circuit for a fuel pump that includes a printed circuit board and at least one of electric components and electronic components arranged on one side of the printed circuit board, the housing comprising:
    a base;
    a plurality of covers connected to the base, wherein each of the covers is respectively arranged on a different one of two sides of the printed circuit board such that each of the components is arranged in a region covered by one of the covers; and
    enclosed metallic tracks arranged in at least regions of the printed circuit board that bear the covers, wherein each of the plurality of covers is connected to a respective one of the metallic tracks in a cover-bearing region by a soldered connection.

2. The housing as claimed in claim 1, wherein a material of the metallic tracks includes a material of conductor tracks with which the components are connected to one another.

3. The housing as claimed in claim 2, wherein the material includes one of copper and gold.

4. The housing as claimed in claim 1, wherein a width of the metallic tracks is greater than that of a region of the covers connected to the printed circuit board via the soldered connection.

5. The housing as claimed in claim 1, wherein the printed circuit board includes contacts electrically, conductively connected to the components, and wherein the connection of the components to the contacts is made via connecting lines embedded in the printed circuit board.

6. The housing as claimed in claim 5, characterized in that the contacts are arranged outside the metallic tracks on the printed circuit board.

7. The housing according to claim 5, wherein the contacts are arranged inside the metallic tracks but outside the covers, and wherein the metallic tracks surround the contacts at a distance embodied as an annular gap.

8. The housing as claimed in claim 1, further comprising:
    a blocking layer that connects the metallic tracks to both sides of the printed circuit board, and is arranged on a periphery of the printed circuit board.

* * * * *